(12) United States Patent
D'Evelyn

(10) Patent No.: US 8,878,230 B2
(45) Date of Patent: Nov. 4, 2014

(54) SEMI-INSULATING GROUP III METAL NITRIDE AND METHOD OF MANUFACTURE

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 42 days.

(21) Appl. No.: 13/041,199

(22) Filed: Mar. 4, 2011

(65) Prior Publication Data

US 2011/0220912 A1    Sep. 15, 2011

Related U.S. Application Data

(60) Provisional application No. 61/313,112, filed on Mar. 11, 2010.

(51) Int. Cl.
| | | |
|---|---|---|
| H01L 29/20 | (2006.01) | |
| H01L 21/322 | (2006.01) | |
| C30B 7/10 | (2006.01) | |
| C30B 29/40 | (2006.01) | |
| H01L 21/02 | (2006.01) | |
| H01L 33/32 | (2010.01) | |

(52) U.S. Cl.
CPC ............ *H01L 21/3221* (2013.01); *C30B 7/105* (2013.01); *C30B 29/406* (2013.01); *H01L 21/0254* (2013.01); *H01L 21/02573* (2013.01); *H01L 21/02581* (2013.01); *H01L 21/02667* (2013.01); *H01L 33/32* (2013.01)
USPC .............. 257/102; 257/76; 257/101; 257/627

(58) Field of Classification Search
USPC ............................ 257/76, 79, 101, 102, 627
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,066,868 A | 1/1978 | Witkin et al. | |
| 4,350,560 A | 9/1982 | Helgeland et al. | |
| 4,430,051 A | 2/1984 | Von Platen | |
| 5,098,673 A | 3/1992 | Engel et al. | |
| 5,169,486 A | 12/1992 | Young et al. | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,273,948 B1 | 8/2001 | Porowski et al. | |
| 6,350,191 B1 | 2/2002 | D'Evelyn et al. | |
| 6,372,002 B1 | 4/2002 | D'Evelyn et al. | |
| 6,398,867 B1 | 6/2002 | D'Evelyn et al. | |
| 6,406,540 B1 | 6/2002 | Harris et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,528,427 B2 | 3/2003 | Chebi et al. | |
| 6,533,874 B1 | 3/2003 | Vaudo et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |
| 6,686,608 B1 * | 2/2004 | Takahira .................. | 257/96 |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 * | 9/2004 | Udagawa .................. | 257/101 |
| 6,806,508 B2 | 10/2004 | D'Evelyn et al. | |
| 6,858,882 B2 | 2/2005 | Tsuda et al. | |
| 6,861,130 B2 | 3/2005 | D'Evelyn et al. | |
| 6,887,144 B2 | 5/2005 | D'Evelyn et al. | |
| 6,936,488 B2 | 8/2005 | D'Evelyn et al. | |
| 6,955,719 B2 | 10/2005 | Dmitriev et al. | |
| 7,001,577 B2 | 2/2006 | Zimmerman et al. | |
| 7,009,199 B2 | 3/2006 | Hall et al. | |
| 7,009,215 B2 | 3/2006 | D'Evelyn et al. | |
| 7,012,279 B2 | 3/2006 | Wierer Jr. et al. | |
| 7,026,755 B2 | 4/2006 | Setlur et al. | |
| 7,026,756 B2 | 4/2006 | Shimizu et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |

(Continued)

FOREIGN PATENT DOCUMENTS

| | | |
|---|---|---|
| CN | 101061570 | 10/2007 |
| JP | 2005-289797 A2 | 10/2005 |
| JP | 2007-039321 A | 2/2007 |
| WO | WO 2005121415 A1 | 12/2005 |
| WO | WO 2006/057463 | 1/2006 |
| WO | WO 2006/038467 | 4/2006 |
| WO | WO2007-004495 | 1/2007 |
| WO | WO 2010/068916 | 6/2010 |
| WO | WO2012-016033 | 2/2012 |

OTHER PUBLICATIONS

Office Action for U.S. Appl. No. 12/497,969 (Feb. 2, 2012).
Office Action for U.S. Appl. No. 12/478,736 (Feb. 7, 2012).
Office Action for U.S. Appl. No. 12/569,841 (Dec. 23, 2011).
Office Action for U.S. Appl. No. 12/724,983 (Mar. 5, 2012).
Office Action for U.S. Appl. No. 12/785,404 (Mar. 5, 2012).

(Continued)

*Primary Examiner* — Ori Nadav
(74) *Attorney, Agent, or Firm* — Kilpatrick Townsend & Stockton LLP

(57) ABSTRACT

A large-area, high-purity, low-cost single crystal semi-insulating gallium nitride that is useful as substrates for fabricating GaN devices for electronic and/or optoelectronic applications is provided. The gallium nitride is formed by doping gallium nitride material during ammonothermal growth with a deep acceptor dopant species, e.g., Mn, Fe, Co, Ni, Cu, etc., to compensate donor species in the gallium nitride, and impart semi-insulating character to the gallium nitride.

22 Claims, No Drawings

(56) References Cited

U.S. PATENT DOCUMENTS

| | | |
|---|---|---|
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 * | 8/2009 | Spencer et al. ............... 423/490 |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 * | 7/2010 | Chiu et al. .................... 257/253 |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 * | 10/2012 | Mattmann et al. ............. 257/43 |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 * | 2/2004 | Chua et al. ..................... 438/47 |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 * | 12/2004 | D'Evelyn et al. ............... 257/94 |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 * | 9/2007 | D'Evelyn et al. ............... 257/94 |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 * | 1/2008 | Eichler et al. ............ 372/45.012 |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |

(56) References Cited

U.S. PATENT DOCUMENTS

| | | |
|---|---|---|
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1* | 1/2012 | Feezell et al. ............ 257/76 |
| 2012/0025231 A1* | 2/2012 | Krames et al. ............ 257/93 |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

OTHER PUBLICATIONS

Office Action for U.S. Appl. No. 12/491,176 (Mar. 1, 2012).
Fukuda et al, "Prospects for the ammonothermal growth of large GaN crystal," Journal of Crystal Growth 305:304-310 (Jul. 2007).
Lide et al., 'Thermal Conductivity of Ceramics and Other Insulating Materials,' CRC Handbook of Chemistry and Physics, 91st Edition, 2010-2011, pp. 12-203 and 12-204.
Pattison et al., 'Gallium Nitride Based Microcavity Light Emitting Diodes With 2λ Effective Cavity Thickness', Applied Physics Letters, vol. 90, Issue 3, 031111 (2007) 3pg.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Office Action for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,844 dated Sep. 16, 2010.
USPTO Office Action for U.S. Appl. No. 12/534,844 dated Feb. 2, 2011.
USPTO Office Action for U.S. Appl. No. 12/534,857 dated Sep. 1, 2010.
USPTO Office Action for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
Chiang et al. "Luminescent Properties of Cerium-Activated Garnet Series Phosphor: Structure and Temperature Effects," Journal of the Electrochemical Society 155:B517-B520 (2008).
Chiu et al. "Synthesis and Luminescence Properties of Intensely Red-Emitting M5Eu$(WO_4)_{4-x}(MoO_4)_x$ (M = Li, Na, K) Phosphors," Journal of the Electrochemical Society 15:J71-J78 (2008).
Ci et al. "$Ca_{1-x}Mo_{1-y}Nb_yO_4$:$Eu_x^{3+}$: A novel red phosphor for white light emitting diodes," Journal of Physics 152:670-674 (2008).
Happek "Development of Efficient UV-LED Phosphor Coatings for Energy Saving Solid State Lighting" University of Georgia (Jan. 2007).

(56) References Cited

OTHER PUBLICATIONS

Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8$:$Eu_2$+ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

USPTO Office Action for U.S. Appl. No. 12/497,969 dated Jul. 5, 2012.

USPTO Office Action for U.S. Appl. No. 12/534,843 dated Sep. 10, 2012.

USPTO Notice of Allowance for U.S. Appl. No. 12/534,849 dated Jul. 31, 2012.

USPTO Notice of Allowance for U.S. Appl. No. 12/785,404 dated Jul. 16, 2012.

USPTO Office Action for U.S. Appl. No. 13/179,346 dated Aug. 17, 2012.

USPTO Notice of Allowance for U.S. Appl. No. 13/425,304 dated Aug. 22, 2012.

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on *m*-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Choi et al., '2.51 microcavity InGaN light-emitting diodes fabricated by a selective dry-etch thinning process', Applied Physics Letters, 2007, 91(6), 061120.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

(56) References Cited

OTHER PUBLICATIONS

USPTO Notice of Allowance for U.S. Appl. No. 12/478,736 dated Oct. 9, 2012.
USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Oct. 1, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/175,739 dated Dec. 7, 2012.
USPTO Office Action for U.S. Appl. No. 13/179,346 dated Dec. 13, 2012.
USPTO Office Action for U.S. Appl. No. 13/226,249 dated Oct. 10, 2012.
Copel et al., 'Surfactants in Epitaxial Growth', Physical Review Letters, Aug. 7, 1989, vol. 63, No. 6, p. 632-635.
Lu et al., 'Structure of the CI-passivated GaAs(111) surface', Physical Review B, Nov. 15, 1998, vol. 58, No. 20, pp. 13820-13823.
Massies et al., 'Surfactant mediated epitaxial growth of InxGa1-xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/272,981 dated Aug. 15, 2013, 13 pages.
Altoukhov et al., 'High reflectivity airgap distributed Bragg reflectors realized by wet etching of AlInN sacrificial layers', Applied Physics Letters, vol. 95, 2009, pp. 191102-1-3.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride-A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and optical properties of bulk GaN crystals fabricated through hydride vapor phase epitaxy with void-assisted separation', Journal of Applied Physics, 98, 2005, pp. 103509-1-103509-4.

International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013.
USPTO Office Action for U.S. Appl. No. 12/133,365 dated May 13, 2013.
USPTO Office Action for U.S. Appl. No. 12/497,969 dated May 16, 2013.
USPTO Notice of Allowance for U.S. Appl. No. 12/534,843 dated Jan. 24, 2013.
USPTO Notice of Allowance for U.S. Appl. No. 12/634,665 dated Feb. 15, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Notice of Allowance for U.S. Appl. No. 13/226,249 dated Feb. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
Oshima et al., Thermal and optical properties of bulk GaN crystals fabricated through hydride vapor phase epitaxy with void-assisted separation, Journal of Applied Physics, 98, 103509-1/4, 2005.
Fang et al., Deep centers in semi-insulating Fe-doped native GaN substrates grown by hydride vapour phase epitaxy, Physica Status Solidi (c), 5(6),1508-1511, 2008.
Gladkov et al., Effect of Fe doping on optical properties of freestanding semi-insulating HVPE GaN:Fe, Journal of Crystal Growth, 312, 1205-1209, 2010.
Porowski et al., High resistivity GaN single crystalline substrates, Acta Physica Polonica A, 92(5), 958-962, 1997.
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
USPTO Office Action for U.S. Appl. No. 13/472,356 dated Dec. 9, 2013 (11 pages).
Roder et al., 'Temperature dependence of the thermal expansion of GaN', Physics Review B, vol. 72., No. 085218, Aug. 24, 2005.
USPTO Office Action for U.S. Appl. No. 12/133,365 dated Feb. 20, 2014 (32 pages).
USPTO Office Action for U.S. Appl. No. 12/636,683 dated Feb. 24, 2014 (16 pages).
USPTO Office Action for U.S. Appl. No. 13/013,697 dated Jun. 9, 2014 (5 pages).
USPTO Notice of Allowance for U.S. Appl. No. 13/272,981 dated Mar. 13, 2014 (10 pages).

* cited by examiner

SEMI-INSULATING GROUP III METAL NITRIDE AND METHOD OF MANUFACTURE

CROSS-REFERENCE TO RELATED APPLICATION

This patent application claims priority from U.S. patent application Ser. No. 61/313,112, filed Mar. 11, 2010, and entitled "Improved Semi-Insulating Group III Metal Nitride and Method of Making."

BACKGROUND OF THE INVENTION

The present invention generally relates to processing of materials for growth of crystals. More particularly, the present invention provides a semi-insulating gallium-containing nitride crystal synthesized by an ammonobasic or ammonoacidic technique. The present invention provides methods suitable for synthesis of polycrystalline nitride materials, as well as other crystals and materials. Such crystals and materials include, but are not limited to, GaN, AN, InN, InGaN, AlGaN, and AlInGaN, and for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors.

Gallium nitride containing crystalline materials serve as substrates for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Quality substrates comprising bulk gallium nitride are available commercially, however, in most cases, these substrates are electrically conductive. In some cases, a substrate that is electrically insulating or semi-insulating is desirable. In addition, bulk gallium nitride substrates are generally expensive, and substrate diameters of 2 inches and larger are only available with a c-plane orientation.

Several authors have disclosed the addition of transition metal deep acceptor dopants, e.g., Mn, Fe, Co, Ni, Cu, etc., to compensate donor species in the gallium nitride, and impart semi-insulating character to the gallium nitride. For example, Monemar and Lagerstedt [J. Appl. Phys. 50, 6480 (1979)] added Fe or Cr to GaN grown by hydride vapor phase epitaxy (HVPE) and obtained highly resistive crystals. Heikman et al. [Appl. Phys. Lett. 81, 439 (2002)] introduced Fe into GaN films grown by metalorganic chemical vapor deposition (MOCVD) and similarly obtained semi-insulating character. Generally, these authors were not able to obtain high quality, free standing bulk GaN wafers.

U.S. Pat. No. 6,273,948, issued to Porowski et al., describes a method of fabricating highly resistive GaN bulk crystals by crystallization from a solution of atomic nitrogen in a molten mixture of gallium and Group II metal such as beryllium or calcium, under a high pressure of about 0.5-2.0 GPa and a high temperature of 1300-1700 degrees Celsius. A resistivity of $10^4$ to $10^8$ ohm-centimeter (ohm-cm) was achieved. The crystal obtained from the process was about 1 cm in size, whereas most commercial electronic applications require a substrate size of at least about 2 inches (>5 cm) diameter.

U.S. Pat. No. 7,170,095, issued to Vaudo et al., describes an improved HVPE method for doping free-standing GaN crystals with relatively high crystalline quality. The HVPE technique, however, generally produces bulk GaN crystals of relatively high cost. U.S. Pat. No. 7,078,731, issued to D'Evelyn et al., teaches an ammonothermal method for synthesizing semi-insulating GaN crystals, for example, by doping with Fe or Co. The Fe-doped and Co-doped GaN crystals, however, are reddish/amber or black in color, respectively, rather than transparent and colorless.

What is needed is a method for low-cost manufacturing of semi-insulating nitride materials that are transparent, colorless, and of high crystallographic quality.

DETAILED DESCRIPTION OF THE INVENTION

Approximating language, as used herein throughout the specification and claims, may be applied to modify any quantitative representation that could permissibly vary without resulting in a change in the basic function to which it may be related. Accordingly, a value modified by a term such as "about" is not limited to the precise value specified. In at least one instance, the variance indicated by the term "about" may be determined with reference to the precision of the measuring instrumentation. Similarly, "free" may be combined with a term; and, may include an insubstantial number, or a trace amount, while still being considered free of the modified term unless explicitly stated otherwise.

The metal of a metal nitride may include a group III metal. Suitable metals may include aluminum, gallium, and indium. The "one or more" refers to combination of metals in the metal nitride, and may include compositions such as aluminum gallium nitride (AlGaN), and the like. As used herein, the term "gallium nitride" will be used as an illustrative example of a metal nitride, but it is understood that other group III metal nitrides are also possible.

A metal nitride composition may contain impurities. As used herein, the term "impurity" refers to a chemical species that is distinct from the group III metal nitride that constitutes the majority composition of the single-crystal or polycrystalline metal nitride. Several classes of impurities may be distinguished, with respect to chemistry, atomic structure, intent, and effect. Impurities will generally comprise elements distinct from nitrogen, aluminum, gallium, and indium, including oxygen, carbon, halogens, hydrogen, alkali metals, alkaline earth metals, transition metals, and main block elements. The impurity may be present in a number of forms, with different atomic structure. In some cases, the impurity is present as an isolated atom or ion within the crystalline lattice of the group III metal nitride, for example, as a substitutional or interstitial impurity. In other cases, the impurity is present in a distinct phase, for example, as an inclusion within an individual group III metal nitride grain or within a grain boundary of the group III metal nitride. The impurity may be deliberately added, to enhance the properties of the group III metal nitride in some way, or may be unintentional. Finally, the impurity may or may not have a significant effect on the electrical, crystallographic, chemical, or mechanical properties of the group III metal nitride.

As used herein, and as is commonly used in the art, the term "dopant" refers to an impurity that is atomically dispersed within the group III metal nitride, for example, as a substitutional or interstitial impurity, and which is typically added intentionally. With regard to dopants and dopant precursors (collectively "dopants" unless otherwise indicated), the electrical properties of the group III metal nitride composition may be controlled by adding one or more of such dopants to the above composition during processing. The dopant may also provide magnetic and/or luminescent properties to the group III metal nitride composition. Suitable dopants may include one or more of s or p block elements, transition metal elements, and rare earth elements. Suitable s and p block elements include, for example, silicon, germanium, magnesium, and tin. Other suitable dopants may include transition group elements. Suitable transition group elements include, for example, zinc, iron, or cobalt. Suitable dopants may produce an n-type material, a p-type material, or a semi-insulating material. In some embodiments, oxygen, whether added intentionally or unintentionally, also acts as a dopant.

Suitable dopant concentration levels in a single-crystal or polycrystalline composition may be greater than about $10^{10}$ atoms per cubic centimeter. In one embodiment, the dopant concentration may be in a range of from about $10^{10}$ atoms per cubic centimeter to about $10^{15}$ atoms per cubic centimeter, from about $10^{15}$ atoms per cubic centimeter to about $10^{16}$ atoms per cubic centimeter, from about $10^{16}$ atoms per cubic centimeter to about $10^{17}$ atoms per cubic centimeter, from about $10^{17}$ atoms per cubic centimeter to about $10^{18}$ atoms per cubic centimeter, from about $10^{18}$ atoms per cubic centimeter to about $10^{21}$ atoms per cubic centimeter, or greater than about $10^{21}$ atoms per cubic centimeter.

As used herein, the term "getter" refers to an impurity that is intentionally added and has a higher chemical affinity for an undesired impurity, for example, oxygen, than the principal metallic constituent of the composition, for example, gallium. The getter may become incorporated into the polycrystalline group III metal nitride in the form of an inclusion, for example, as a metal nitride, a metal halide, a metal oxide, a metal oxyhalide, or as a metal oxynitride. Examples of suitable getters include the alkaline earth metals, scandium, titanium, vanadium, chromium, yttrium, zirconium, niobium, the rare earth metals, hafnium, tantalum, and tungsten, and their nitrides and halides. In some embodiments, the getter impurity can act as both a getter and a dopant, such as magnesium. In other cases, the getter impurity atom has a larger atomic or covalent diameter than gallium and does not become incorporated as a dopant at sufficient levels to modify the electrical properties of the group III metal nitride significantly, and therefore functions predominantly or exclusively as a getter. The getter may be present in the polycrystalline group III metal nitride at a level greater than 100 ppm, from about 100 ppm to about 200 ppm, from about 200 ppm to about 500 ppm, from about 500 ppm to about 0.1%, from about 0.1% to about 0.2%, from about 0.2% to about 0.5%, from about 0.5% to about 2%, from about 2% to about 10%, or greater than 10%. Parts per million (ppm) and "%" refer to "by weight" unless otherwise indicated.

In other cases, impurities are unintended and/or undesirable inclusions in the polycrystalline group III metal nitride, and may result from, for example, processing and handling. Other unintentional impurities may result from contaminants in raw materials. Some unintentional impurities may be more closely associated with select raw materials. In some embodiments, the unintentional impurity includes oxygen present as a substitutional impurity, or dopant, in the polycrystalline group III metal nitride at higher than the desired level. In other embodiments, the unintentional impurity includes oxygen present as a group III oxide inclusion, for example, $Ga_2O_3$, $Al_2O_3$, and/or $In_2O_3$. The unintentional oxygen impurity may originate from residual oxygen in the metal raw material, from moisture or $O_2$ present as an impurity in the gaseous raw materials used in the synthesis process, from moisture generated from outgassing of the reactor components during the synthesis process, or from an air leak in the reactor. In one embodiment, the oxygen content present as $Ga_2O_3$ or as a substitutional impurity within gallium nitride may be less than about 10 parts per million (ppm). In another embodiment, the oxygen content present as $Ga_2O_3$ or as a substitutional impurity within gallium nitride may be in a range of from about 10 parts per million to about 3 parts per million, from about 3 parts per million to about 1 part per million, from about 1 part per million to about 0.3 parts per million, from about 0.3 part per million to about 0.1 parts per million, or less than about 0.1 part per million.

A high-quality semi-insulating, transparent, gallium nitride or metal nitride crystal or wafer may be manufactured cost-effectively by the following method.

One or more high-quality gallium nitride seed crystals or plates may be provided. The seed plates may have a minimum lateral dimension of at least one centimeter. In some embodiments, the seed plates have a maximum lateral dimension of at least two centimeters and a minimum lateral dimension of at least one centimeter. In other embodiments, the seed plates have minimum lateral dimensions of at least three centimeters, at least four centimeters, at least five centimeters, at least six centimeters, at least eight centimeters, or at least ten centimeters. In some embodiments, the seed plates are bulk single crystals of gallium nitride. In some embodiments the seed plates are prepared from crystals that were grown by hydride vapor phase epitaxy. In other embodiments, the seed plates are prepared from crystals that were grown ammonothermally. In still other embodiments, the seed plates are prepared from crystals that were grown from solution in a flux. In some embodiments, the dislocation density at the large-area surfaces of the seed plates is less than about $10^6$ cm$^{-2}$. In some embodiments, the dislocation density at the large-area surfaces of the seed plates is less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

In one specific embodiment, the orientation of the large-area surfaces of the seed plates is within about 5 degrees, within about 2 degrees, within about 1 degree, within about 0.5 degree, within about 0.2 degree, or within about 0.1 degree of a {1 0 –1 0} m plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a (0 0 0 ±1) c plane. In another specific embodiment, the orientation of the large-area surfaces of the seed plates is within about 5 degrees, within about 2 degrees, within about 1 degree, within about 0.5 degree, within about 0.2 degree, or within about 0.1 degree of a {1 1 –2 0} a plane. In some embodiments, the seed plate has a semi-polar large-surface orientation, which may be designated by (hkil) Bravais-Miller indices, where i=–(h+k), l is nonzero and at least one of h and k are nonzero. In a specific embodiment, the orientation of the large-area surfaces of the seed plates is within about 5 degrees, within about 2 degrees, within about 1 degree, within about 0.5 degree, within about 0.2 degree, or within about 0.1 degree of {1 –1 0 ±1}, {1 –1 0 ±2}, {1 –1 0 ±3}, {2 0 –2 ±1} or {1 1 –2 ±2}.

The one or more seed plates may be affixed to a seed rack, as described in U.S. patent application Ser. No. 12/534,844, which is hereby incorporated by reference in its entirety. If the front and back faces of the seed plates are crystallographically inequivalent, as with a c-plane or semi-polar orientation, two seed plates may be placed back to back so that the outward-facing surfaces have an equivalent crystallographic orientation.

A polycrystalline group III metal nitride or gallium nitride nutrient material may be provided, as described in U.S. patent application Ser. No. 61/122,332, which is hereby incorporated by reference in its entirety. The polycrystalline group III metal nitride may have an oxygen content in the group III metal nitride material provided as a group III metal oxide or as a substitutional impurity within a group III metal nitride that is less than about 10 parts per million (ppm), less than about 1 ppm, or less than about 0.1 ppm. The polycrystalline group III metal nitride may comprise a getter at a level of at least 100 ppm with respect to the group III metal, where the getter is selected from at least alkaline earth metals, scandium, titanium, vanadium, chromium, yttrium, zirconium, niobium, rare earth metals, hafnium, tantalum, and tungsten. The polycrystalline group III metal nitride may further comprise a compensatory dopant, at a level between about $10^{14}$ cm$^{-3}$ and about $10^{20}$ cm$^{-3}$, where the compensatory dopant is selected from at least V, Cr, Mo, W, Mn, Re, Fe, Ru, Os, Co, Rh, Ir, Ni, Pd, Pt, Cu, Ag, Au, Zn, Cd and Hg. The compensatory dopant may be formed in the polycrystalline group III metal nitride by addition of at least one of V, Cr, Mo, W, Mn, Re, Fe, Ru, Os, Co, Rh, Ir, Ni, Pd, Pt, Cu, Ag, Au, Zn, Cd and Hg to gallium or a group III metal prior or during the process whereby the gallium or group III metal is reacted with ammonia in the presence of a hydrogen halide to form the polycrystalline metal nitride.

The polycrystalline group III metal nitride may be placed in a basket, which is then placed in an autoclave or a capsule, as described in U.S. Pat. Nos. 6,656,615, 7,125,453, and 7,078,731 and in U.S. patent application Ser. No. 12/133,365, each of which is incorporated by reference in their entirety. Ammonia and a mineralizer, for example, at least one of an alkali metal, amide, nitride, or azide, an alkaline earth metal, amide, nitride, or azide, ammonium fluoride, ammonium chloride, a group III metal fluoride, a group III metal chloride, or a reaction product between a group III metal, ammonia, HF, and HCl are also placed in the autoclave or capsule.

In some embodiments a getter is also placed in the autoclave or capsule. The added getter may be provided in addition to a getter composition that may be present in the polycrystalline group III nitride. The added getter may comprise at least one of alkaline earth metals, Sc, Ti, V, Cr, Y, Zr, Nb, Hf, Ta, W, rare earth metals, and their nitrides, halides, oxynitrides, oxyhalides, amides, imides, and azides. In one specific embodiment, at least a portion of the getter is added in the form of a metal and at least a portion of the mineralizer is added as an azide in such a ratio that the hydrogen generated by reaction of the getter metal with ammonia and the nitrogen generated by decomposition of the azide are present in a ratio of approximately 3:1, as described in U.S. patent application Ser. No. 61/086,799, which is hereby incorporated by reference in its entirety. The added getter may be useful for removing unintentional impurities, for example, oxygen, that are present in the mineralizer or other raw material. In one set of embodiments, the mineralizer comprises an alkali metal and the getter comprises a nitride, imide, or amide of Be, Mg, Ca, Sr, Ba, Sc. Y, a rare earth metal, Ti, Zr, Hf, V, Nb, Ta, Cr, Mo, or W. In another set of embodiments, the mineralizer comprises Cl and the getter comprises a nitride, chloride, oxynitride, or oxychloride of Sc, Cr, Zr, Nb, Hf, Ta, or W. In still another set of embodiments, the mineralizer comprises F and the getter comprises a nitride, fluoride, oxynitride, or oxyfluoride of Cr, Zr, Nb, Hf, Ta, or W.

After all the raw materials have been added to the autoclave or capsule, the autoclave or capsule is sealed.

The capsule, if employed, is then placed within a suitable high pressure apparatus. In one embodiment, the high pressure apparatus comprises an autoclave, as described by U.S. Pat. No. 7,335,262, which is hereby incorporated by reference in its entirety. In another embodiment, the high pressure apparatus is an internally heated high pressure apparatus, as described in U.S. Pat. No. 7,125,453, and in U.S. Patent Applications 2006/0177362A1 and U.S. Ser. No. 12/133,364, which are hereby incorporated by reference in their entirety. The polycrystalline group III metal nitride and seed crystals are then processed in supercritical ammonia at a temperature greater than about 400 degrees Celsius and a pressure greater than about 0.2 gigaPascal (GPa), during which at least a portion of the polycrystalline group III metal nitride is etched away and recrystallized onto at least one group III nitride crystal with a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 0.3 GPa, greater than about 0.4 GPa, greater than about 0.5 GPa, greater than about 0.6 GPa, greater than about 0.7 GPa, or greater than about 0.8 GPa.

Residual getter in the polycrystalline group III metal nitride is released into solution gradually, as the polycrystalline group III metal nitride is etched. Once in solution, the getter may react to form a getter metal nitride, amide, or halide. The getter may also be chemically bound to oxygen. The getter may remove residual oxygen in the supercritical ammonia solution, enabling growth of group III nitride single crystals with improved purity and transparency, enabling semi-insulating character at lower concentrations of the compensatory dopant.

The ammonothermally-grown crystalline group III metal nitride may be characterized by a wurtzite structure substantially free from any cubic entities and have an optical absorption coefficient of about 2 cm$^{-1}$ and less at wavelengths between about 385 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ cm$^{-3}$, greater than $10^{15}$ cm$^{-3}$, or greater than $10^{16}$ cm$^{-3}$ of at least one of Li, Na, K, Rb, Cs, Mg, Ca, F, and Cl, and an optical absorption coefficient of about 2 cm$^{-1}$ and less at wavelengths between about 385 nanometers and about 750 nanometers. The ammonothermally-grown gallium nitride crystal may be semi-insulating, with a resistivity greater than $10^5$ Ω-cm, greater than $10^6$ Ω-cm, greater than $10^7$ Ω-cm, greater than $10^8$ Ω-cm, greater than $10^9$ Ω-cm, greater than $10^{10}$ Ω-cm, greater than $10^{11}$ Ω-cm, or greater than $10^{12}$ Ω-cm at room temperature. The ammonothermally-grown crystalline group III metal nitride may be characterized by a concentration of at one or more compensatory dopants that is less than about than $10^{14}$ cm$^{-3}$, less than about than $10^{15}$ cm$^{-3}$, less than about than $10^{16}$ cm$^{-3}$, less than about than $10^{17}$ cm$^{-3}$, less than about than $10^{18}$ cm$^{-3}$, or less than about $10^{19}$ cm$^{-3}$. The compensatory dopant may be selected from at least V, Cr, Mo, W, Mn, Re, Fe, Ru, Os, Co, Rh, Ir, Ni, Pd, Pt, Cu, Ag, Au, Zn, Cd and Hg. In a preferred embodiment, the concentration of the compensatory dopant in the ammonothermally-grown crystalline group III metal nitride is greater than the sum of the concentrations of oxygen and silicon. The optical absorption coefficient of the ammonothermally-grown crystalline group III metal nitride at wavelengths between about 395 nm and about 460 nm may be less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$.

By growing for a suitable period of time, the semi-insulating ammonothermally-grown crystalline group III metal nitride may have a thickness of greater than about 1 millimeter and a length, or diameter, greater than about 20 millimeters. In a preferred embodiment, the length is greater than about 50 millimeters or greater than about 100 millimeters. After growth, the ammonothermally-grown crystalline group III metal nitride may be sliced, polished, and chemical-mechanically polished according to methods that are known in the art to form one or more wafers or crystalline substrate members. In a preferred embodiment, the root-mean-square surface roughness of the at least one wafer or crystalline substrate member is less than about one nanometer, for example, as measured by atomic force microscopy over an area of at least about 10 micrometers by 10 micrometers.

The semi-insulating ammonothermally-grown crystalline group III metal nitride crystal, or a wafer sliced and polished from the crystal, may be used as a substrate for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A bulk gallium-containing nitride crystal comprising:
a length greater than about 5 millimeters;
a wurtzite crystal structure;
a concentration of oxygen from about $10^{10}$ atoms per cubic centimeter to about $10^{17}$ atoms per cubic centimeter;
an impurity concentration greater than about $10^{15}$ cm$^{-3}$ of at least one of Li, Na, K, Rb, Cs, Ca, F, and Cl;
a compensatory dopant selected from V, Cr, Mo, W, Mn, Re, Fe, Ru, Os, Co, Rh, Ir, Ni, Pd, Pt, Cu, Ag, Au, Zn, Cd, Hg, and a combination of any of the foregoing, wherein the concentration of the compensatory dopant is between about $10^{14}$ cm$^{-3}$ and about $10^{16}$ cm$^{-3}$;
an optical absorption coefficient less than about 10 cm$^{-1}$ at wavelengths between about 395 nm and about 460 nm; and
an electrical resistivity at room temperature greater than about $10^7$ ohm-centimeter.

2. The gallium-containing nitride crystal of claim 1, comprising an impurity concentration of oxygen less than about $10^{16}$ cm$^{-3}$.

3. The gallium-containing nitride crystal of claim 1, comprising an impurity concentration of oxygen less than about $10^{15}$ cm$^{-3}$.

4. The gallium-containing nitride crystal of claim 1, wherein the concentration of the compensatory dopants is less than about $10^{16}$ cm$^{-3}$.

5. The gallium-containing nitride crystal of claim 1, wherein the optical absorption coefficient at wavelengths between about 395 nm and about 460 nm is less than about 2 cm$^{-1}$.

6. The gallium-containing nitride crystal of claim 1, wherein the optical absorption coefficient at wavelengths between about 395 nm and about 460 nm is less than about 0.2 cm$^{-1}$.

7. The gallium-containing nitride crystal of claim 1, wherein the gallium-containing nitride crystal has a thickness of greater than about 1 millimeter.

8. The gallium-containing nitride crystal of claim 7, wherein the length is greater than about 20 millimeters.

9. The gallium-containing nitride crystal of claim 1, wherein the length is greater than about 100 millimeters.

10. The gallium-containing nitride crystal of claim 1, wherein the crystal is characterized by a crystallographic radius curvature of greater than 100 meters.

11. The gallium-containing nitride crystal of claim 1, comprising a large-area surface characterized by a root-mean-square surface roughness of 1 nanometer and less.

12. The gallium-containing nitride crystal of claim 11, wherein the large-area surface has a crystallographic orientation within about 5 degrees of (0 0 0 ±1) c-plane.

13. The gallium-containing nitride crystal of claim 11, wherein the large-area surface has a crystallographic orientation within about 5 degrees of (1 0 –1 0) m-plane.

14. A device comprising the gallium-containing nitride crystal of claim 1, wherein the device is selected from a light emitting diode, a laser diode, a photodetector, an avalanche photodiode, a transistor, a rectifier, a thyristor; a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

15. The gallium-containing nitride crystal of claim 1, wherein the electrical resistivity at room temperature is greater than about $10^9$ ohm-centimeter.

16. The gallium-containing nitride crystal of claim 1, wherein the electrical resistivity at room temperature is greater than about $10^{11}$ ohm-centimeter.

17. The gallium-containing nitride crystal of claim 1, comprising an oxygen content as a substitutional impurity less than about 10 parts per million.

18. The gallium-containing nitride crystal of claim 1, comprising an oxygen content as a substitutional impurity less than about 1 parts per million.

19. The gallium-containing nitride crystal of claim 1, wherein the gallium-containing nitride crystal is semi-insulating.

20. The gallium-containing nitride crystal of claim 1, wherein the room temperature resistivity is from $10^7$ ohm-centimeters to $10^{12}$ ohm-centimeters.

21. The gallium-containing nitride crystal of claim 1, wherein the crystal is free-standing.

22. A bulk gallium-containing nitride crystal, comprising:
a wurtzite structure;
an impurity concentration greater than about $10^{15}$ cm$^{-3}$ of at least one of Li, Na, K, Rb, Cs, Ca, F, and Cl;
a concentration of oxygen from about $10^{10}$ atoms per cubic centimeter to about $10^{17}$ atoms per cubic centimeter;
a compensatory dopant selected from V, Cr, Mo, W, Mn, Re, Fe, Ru, Os, Co, Rh, Ir, Ni, Pd, Pt, Cu, Ag, Au, Zn, Cd, Hg, and a combination of any of the foregoing, wherein the concentration of the compensatory dopant is between about $10^{14}$ cm$^{-3}$ and about $10^{16}$ cm$^{-3}$;
an optical absorption coefficient less than about 2 cm$^{-1}$ at wavelengths between about 395 nm and about 460 nm; and
an electrical resistivity at room temperature greater than about $10^7$ ohm-centimeter.

\* \* \* \* \*